(12) United States Patent  (10) Patent No.: US 7,693,223 B2
Kishigami  (45) Date of Patent: Apr. 6, 2010

(54) TESTING METHODS OF A SEMICONDUCTOR INTEGRATED INCORPORATING A HIGH-FREQUENCY RECEIVING CIRCUIT AND A DEMODULATION CIRCUIT

(75) Inventor: Shinya Kishigami, Nishinomiya (JP)

(73) Assignee: Sharp Kabushiki Kaisha, Osaka (JP)

( * ) Notice: Subject to any disclaimer, the term of this patent is extended or adjusted under 35 U.S.C. 154(b) by 808 days.

(21) Appl. No.: 11/600,143

(22) Filed: Nov. 16, 2006

(65) Prior Publication Data

US 2007/0115735 A1  May 24, 2007

(30) Foreign Application Priority Data

Nov. 18, 2005  (JP) .............................. 2005-334972

(51) Int. Cl.
H04L 27/00 (2006.01)
(52) U.S. Cl. ....................................... 375/259; 375/224
(58) Field of Classification Search ................. 375/259, 375/224
See application file for complete search history.

(56) References Cited

U.S. PATENT DOCUMENTS

| 6,016,565 | A | * | 1/2000 | Miura ......................... 714/736 |
| 6,073,085 | A | * | 6/2000 | Wiley et al. ................. 702/118 |
| 6,363,504 | B1 | * | 3/2002 | Rhodes et al. ............... 714/724 |
| 6,990,614 | B1 | | 1/2006 | Nagasawa et al. |
| 7,035,751 | B2 | | 4/2006 | Shinagawa et al. |
| 2001/0013110 | A1 | * | 8/2001 | Pierce et al. ................. 714/718 |

FOREIGN PATENT DOCUMENTS

| JP | 6-249926 A | 9/1994 |
| JP | 2001-243791 A | 9/2001 |
| JP | 2002-6007 A | 1/2002 |
| JP | 2003-139818 A | 5/2003 |
| JP | 2004-152027 A | 5/2004 |

OTHER PUBLICATIONS

Huang , "SRAM delay fault modeling and test algorithm development", Proceedings of the ASP-DAC 2004 Design Automation Conference, 2004 Proceedings of the ASP-DAC 2004, Asia and South Pacific Jan. 27-30, 2004 pp. 104-109.*

* cited by examiner

Primary Examiner—Juan A Torres
(74) Attorney, Agent, or Firm—Birch, Stewart, Kolasch & Birch, LLP

(57) ABSTRACT

A semiconductor integrated circuit that can be tested in a reduced test time includes a high-frequency receiving circuit for receiving a high-frequency signal, and a demodulation circuit for demodulating a signal received from the high-frequency receiving circuit. The demodulation circuit includes a Static Random Access Memory (SRAM), an SRAM control circuit, and a test data transmitting circuit. The SRAM control circuit receives, from a semiconductor test device, test data for driving and testing the high-frequency receiving circuit, and writes the test data into the SRAM. The test data transmitting circuit reads out from the SRAM test data for driving and testing the high-frequency receiving circuit, and transmits the test data to the high-frequency receiving circuit.

25 Claims, 9 Drawing Sheets

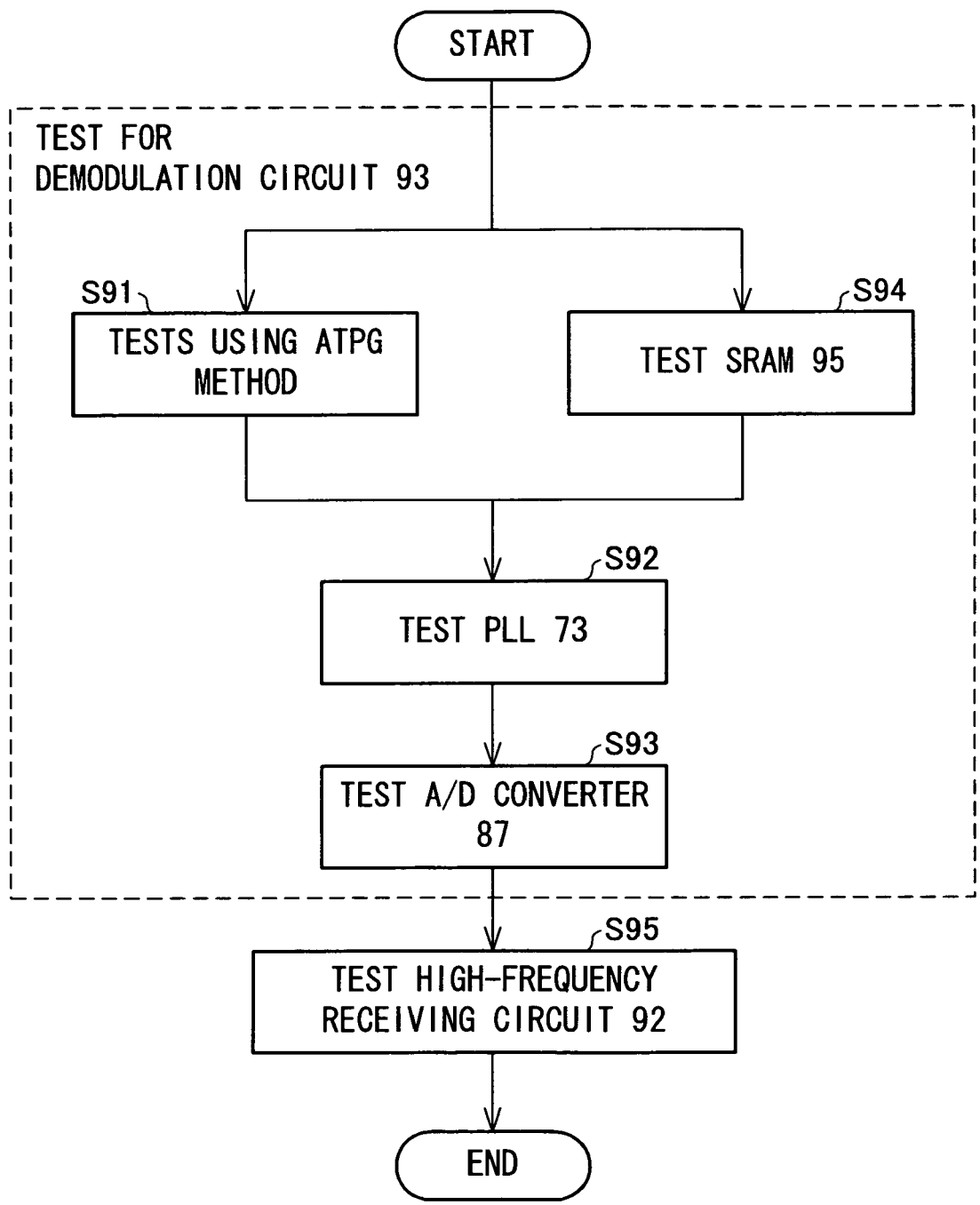

TESTING METHODS OF A SEMICONDUCTOR INTEGRATED INCORPORATING A HIGH-FREQUENCY RECEIVING CIRCUIT AND A DEMODULATION CIRCUIT

This Nonprovisional application claims priority under 35 U.S.C. §119(a) on Patent Application No. 334972/2005 filed in Japan on Nov. 18, 2005, the entire contents of which are hereby incorporated by reference.

FIELD OF THE INVENTION

The present invention relates to (i) a semiconductor intergrated circuit incorporating a high-frequency receiving circuit and a demodulation circuit, (ii) a semiconductor intergrated circuit incorporating a high-frequency transmitting circuit and a modulation circuit, and (iii) test methods thereof.

BACKGROUND OF THE INVENTION

Generally, a broadcast receiver is constituted by a high-frequency receiving circuit and a demodulation circuit, and a broadcast transmitter is constituted by a high-frequency transmitting circuit and a modulation circuit. Although the following will describe a case of a broadcast receiver, the same is applied to a broadcast transmitter.

A high-frequency receiving circuit of a broadcast receiver is generally constituted by an analog circuit, serving as an analog semiconductor integrated circuit. On the contrary, a demodulation circuit is generally constituted by a logic circuit, serving as a logic semiconductor integrated circuit. Since the high-frequency receiving circuit and the demodulation circuit are significantly different from each other regarding their circuit configurations, generally, they have been manufactured as independent semiconductor chips. In recent years, with the development of semiconductor processing techniques, the analog semiconductor integrated circuit and the logic integrated circuit are realized on a single chip.

When such a broadcast receiver is tested, the high-frequency receiving circuit and the demodulation circuit are tested separately. This is because there are significant differences between the demodulation circuit serving as a logic circuit and the high-frequency receiving circuit serving as an analog circuit, with regard to what and how they are tested.

FIG. 8 is a block diagram illustrating a structure in which a semiconductor integrated circuit 92 and a semiconductor test device 77 are provided. The semiconductor integrated circuit 91 includes a high-frequency receiving circuit 92 and a demodulation circuit 93. The high-frequency receiving circuit 92 includes a variable gain amplifier 99. The variable gain amplifier 99 amplifies a high-frequency signal (hereinafter referred to as RF signal), and provides it to a mixer circuit 80.

The high-frequency receiving circuit 92 includes a voltage controlled oscillator (hereinafter referred to as VCO) 81. The VCO 81 generates an oscillation signal that oscillates at a specific frequency, and provides the signal to a phase locked loop circuit (hereinafter referred to as PLL) 82 and a 90 degree phase shifter 84. The PLL circuit 82 locks a phase of the oscillation signal received from the VCO 81, and outputs the signal to a loop filter 83. The loop filter 83 receives the signal from the PLL 82, and outputs it to the VCO 81. The 90 degree phase shifter 84 shifts the phase of the oscillation signal received from the VCO 81 by 90 degrees, and provides it to the mixer circuit 80.

Based on the oscillation signal received from the 90 degree phase shifter 84, the mixer circuit 80 converts the RF signal received from the variable gain amplifier 99 to a signal having an infrasonic frequency (hereinafter referred to as IF signal) ranging from a several MHz to several 10 MHz. Then, the mixer circuit 80 provides the signal thus converted to a low pass filter circuit (LPF) 85. The LPF 85 passes low-frequency components of the IF signal received from the mixer circuit 80 and provides them to a variable gain amplifier 86. The variable gain amplifier 86 amplifies the IF signal received from the LPF 85, and provides it to an A/D converter 87 in the demodulation circuit 93.

The A/D converter 87 converts the IF signal received from the variable gain amplifier 86 to a digital signal, and provides it to the demodulation circuit 88. The demodulation circuit 88 demodulates the digital IF signal received from the A/D converter 87 to a demodulated signal, and provides it to a decoding circuit 89. The decoding circuit 89 decodes the demodulated signal received from the demodulation circuit 88 to generate a decoded signal, and provides it to a deinterleave circuit 70.

The deinterleave circuit 70 rearranges the decoded signal received from the decoding circuit 89 so as to break up sequential errors of the signal, and reconstructs correct data using an error correction technique. For this purpose, the deinterleave circuit 70 stores the decoded signal in an SRAM 95 via a selection circuit 71 provided in an SRAM (Static Random Access Memory) control circuit 94.

The demodulation circuit 93 includes a decoding circuit 72. The decoding circuit 72 reads out from the SRAM 95 decoded signal data, which is reconstructed into correct data by the deinterleave circuit 70 using the error correction technique. The decoding circuit 72 then decodes the decoded signal data thus read out, and outputs it to the semiconductor test device 77 via an output terminal 63.

The demodulation circuit 93 further includes a PLL 73. The PLL 73 outputs a control signal to the A/D converter 87, the demodulation circuit 88, the decoding circuit 89, the deinterleave circuit 70, the decoding circuit 72, and the selection circuit 71.

The semiconductor integrated circuit 91 has input terminals 62, 61, 97, and 60. In order to control an SRAM, generally, a read/write switching signal, an address signal having a width of M bit, and a data signal having a width of N bit are required. In the semiconductor test device 77, a read/write switching signal, an address signal having a width of M bit, and a data signal having a width of N bit are supplied from the SRAM test interface 78 of the semiconductor test device 77 via the input terminals 62, 61, and 97, respectively, and provided to the SRAM 95 by the selection circuit 71. Further, a clock signal is supplied from the SRAM test interface 78 via the input terminal 60, and provided to the SRAM 95 by the selection circuit 71.

The demodulation circuit 93 further includes a demodulation circuit control register 74 and a serial communication circuit 75. The demodulation circuit control register 74 transmits control data concerning: the A/D converter 87, the demodulation circuit 88, the decoding circuit 89, the interleave circuit 70, and the decoding circuit 72, which are provided in the demodulation circuit 93. The control data is transmitted by serial communication performed by the serial communication circuit 75. Further, the demodulation circuit control register 74 transmits to a control register 76, provided in the high-frequency receiving circuit 92, test data which is supplied from the semiconductor test device 77 via the input terminal 64 and which is used to drive and test the VCO 81 and the PLL 82 both provided in the high-frequency receiving circuit 92.

The control register 76 of the high-frequency receiving circuit 92 provides the VCO 81 and the PLL 82 with the test data, received from the control register 74 by serial communication. The result of testing the high-frequency receiving circuit 92 is supplied as a test result signal to the semiconductor test device 77 via a test result output terminal 69, provided in the semiconductor integrated circuit 91. Specifically, the test result signal is outputted from a phase comparator of the PLL 82 via the test result output terminal 69. The test result signal indicates whether or not the VCO 81 oscillates a signal at a specific frequency.

FIG. 9 is a flow chart representing a process of testing the conventional semiconductor integrated circuit 91. First, the demodulation circuit 93 serving as a logic circuit is tested using an Automatic Test Pattern Generation (ATPG) method to detect an error of gates constituting a logic circuit (step S91), while the SRAM 95 of the demodulation circuit 93 is tested for its memory (Step S94). After both the test using the ATPG method and the test for the SRAM 95 are completed, a test for the PLL 73 of the demodulation circuit 93 (step S92) and then a test for the A/D converter 87 of the demodulation circuit 93 (step S93) are performed. Further, the PLL 82 and the VCO 81 both constituting an analog circuit, i.e., the high-frequency receiving circuit 92, are tested to detect, for example, whether or not the VCO 81 oscillates a signal at a desirable frequency (step S95).

In the above conventional structure, however, the following problem may arise, for example, when testing with high accuracy whether the VCO oscillates a signal at a specific frequency. Test data used to test the frequency band of 1 GHz by sampling 100 points at an interval of 10 MHz is transmitted to the control register 76 of the high-frequency receiving circuit 92 from the control register 74 of the demodulation circuit 93. Specifically, the test data is transmitted by serial communication at a slow rate raging from several 10 kHz to several 100 kHz to the receiving end, i.e., the control register 76 provided in the high-frequency receiving circuit 92. Since the high-frequency receiving circuit 92 receives data in a frequency band ranging from several 100 MHz to several GHz, its register has a capacity of several bytes. Thus, it takes time for setting up the control register 76, requiring enormous time for testing the high-frequency receiving circuit 91.

The high-frequency receiving circuit 92 is constituted by an analog circuit, and the demodulation circuit 93 is constituted by a digital circuit. Since there has been no semiconductor test device capable of testing an analog circuit and a digital circuit simultaneously, a test for the high-frequency receiving circuit 92 and a test for the demodulation circuit 93 need to be performed separately. For example, the demodulation circuit 93 is tested first, and then the high-frequency receiving circuit 92 is tested. Tests of a logic circuit generally include a test using the ATPG method and a test for memory, which require more and more time according to increase in size of a circuit. Tests of an analog circuit also take time due to (i) time required for waiting until an analog circuit is stabilized, (ii) a high demand for improving accuracy of tests, and (iii) increased test items. Currently, the tests of the high-frequency receiving circuit 92 and the demodulation circuit 93 have been performed separately, which is disadvantageous in respect of test time.

Japanese Unexamined Patent Publication No. 152027/2004 (Tokukai 2004-152027, publication date: May 27, 2004) (Patent Document 1) discloses a method for testing a semiconductor chip incorporating a digital circuit including a microcomputer unit and a memory unit. However, Patent Document 1 is silent about a test for a semiconductor chip incorporating a high-frequency receiving circuit (analog circuit) and a demodulation circuit (digital circuit). Thus, the present invention is not suggested in Patent Document 1.

Japanese Unexamined Patent Publication No. 243791/2001 (Tokukai 2001-243791, publication date: Sep. 7, 2001) (Patent Document 2) (FIG. 5 and Paragraph [0047] of the specification) discloses a testing device which tests both an analog circuit and a digital circuit. In Patent Document 2, however, the analog circuit and the digital circuit are tested separately. Thus, the present invention is not suggested in Patent Document 2.

SUMMARY OF THE INVENTION

The present invention is made in view of the foregoing problems, and an object of the invention is to realize (i) semiconductor integrated circuits which can be tested in a reduced time and (ii) methods for testing the semiconductor integrated circuits.

According to the present invention, to attain the foregoing object, there is provided a semiconductor integrated circuit including: a high-frequency receiving circuit for receiving a high-frequency signal; and a demodulation circuit for demodulating a signal from the high-frequency receiving circuit, the demodulation circuit including an SRAM, the semiconductor integrated circuit being constituted by one or more semiconductor chips, the demodulation circuit, further including: a write circuit for receiving, from a semiconductor test device, test data for driving and testing the high-frequency receiving circuit so as to write the test data into the SRAM; and a test data transmitting circuit for reading out the test data from the SRAM, and for transmitting the test data thus read out to the high-frequency receiving circuit.

With the above feature, test data for driving and testing the high-frequency receiving circuit is supplied to the write circuit from the semiconductor test device, and stored in the SRAM. The test data stored in the SRAM is read out from the SRAM and transmitted to the high-frequency receiving circuit by the test data transmitting circuit, so that the high-frequency receiving circuit is tested based on the test data. Since the test data is transmitted by the SRAM operating at a high speed, the test data can be transmitted to the high-frequency receiving circuit in a reduced time, compared to the conventional arrangement in which test data is transmitted to a high-frequency receiving circuit through serial communication. This realizes a reduction in test time of the high-frequency receiving circuit, enabling to test a semiconductor integrated circuit in a short time.

According to the present invention, to attain the foregoing object, there is provided another semiconductor integrated circuit including: a modulation circuit for modulating a digital signal; and a high frequency transmitting circuit for transmitting a signal from the modulation circuit; the modulation circuit, including an SRAM, the semiconductor integrated circuit being constituted by one or more semiconductor chips, the modulation circuit, further including: a write circuit for receiving, from a semiconductor test device, test data for driving and testing the high-frequency transmitting circuit so as to write the test data into the SRAM; and a test data transmitting circuit for reading out the test data from the SRAM, and for transmitting the test data thus read out to the high frequency transmitting circuit.

With the above feature, test data for driving and testing the high-frequency transmitting circuit is supplied to the write circuit from the semiconductor test device, and stored in the SRAM. The test data stored in the SRAM is read out from the SRAM and transmitted to the high-frequency transmitting circuit by the test data transmitting circuit, so that the high-frequency transmitting circuit is tested based on the test data. Since the test data is transmitted by the SRAM operating at a high speed, the test data can be transmitted to the high-frequency transmitting circuit in a reduced time, compared to the conventional arrangement in which test data is transmitted to a high-frequency transmitting circuit through serial communication. This realizes a reduction in test time of the high-frequency transmitting circuit, enabling to test a semiconductor integrated circuit in a short time.

According to the present invention, to attain the foregoing object, there is provided a method for testing a semiconductor integrated circuit, the semiconductor integrated circuit, including: a high frequency receiving circuit for receiving a high frequency signal; and a demodulation circuit for demodulating a signal from the high-frequency receiving circuit, the demodulation circuit including an SRAM, the semiconductor integrated circuit being constituted by one or more semiconductor chips, the method, including the steps of: (i) receiving test data for driving and testing the high-frequency receiving circuit, and writing the test data into the SRAM; (ii) reading out, from the SRAM, the test data for driving and testing the high-frequency receiving circuit, and transmitting the test data thus read out to the high-frequency receiving circuit; and (iii) driving and testing the high-frequency receiving circuit, in response to the test data which has been read out from the SRAM and transmitted to the high frequency receiving circuit.

With the above feature, test data for driving and testing the high-frequency receiving circuit is supplied from the semiconductor test device, and stored in the SRAM. The test data stored in the SRAM is read out from the SRAM and transmitted to the high-frequency receiving circuit, so that the high-frequency receiving circuit is tested based on the test data. Since the test data is transmitted by the SRAM operating at a high speed, the test data can be transmitted to the high-frequency receiving circuit in a reduced time, compared to the conventional arrangement in which test data is transmitted to a high-frequency receiving circuit through serial communication. This realizes reduction in test time of the high-frequency receiving circuit, enabling to test a semiconductor integrated circuit in a short time.

According to the present invention, to attain the foregoing object, there is provided a method for testing another semiconductor integrated circuit, the semiconductor integrated circuit including: a modulation circuit for modulating a digital signal; and a high frequency transmitting circuit for transmitting a signal from the modulation circuit; the modulation circuit including an SRAM, the semiconductor integrated circuit being constituted by one or more semiconductor chips, the method, including the steps of: receiving test data for driving and testing the high-frequency transmitting circuit, and writing the test data into the SRAM; and driving and testing the high-frequency transmitting circuit, based on the test data which has been read out from the SRAM and transmitted to the high-frequency transmitting circuit.

With the above feature, test data for driving and testing the high-frequency transmitting circuit is supplied from the semiconductor test device, and stored in the SRAM. The test data stored in the SRAM is read out from the SRAM and transmitted to the high-frequency transmitting circuit, so that the high-frequency transmitting circuit is tested based on the test data. Since the test data is transmitted by the SRAM operating at a high speed, the test data can be transmitted to the high-frequency transmitting circuit in a reduced time, compared to the conventional arrangement in which test data is transmitted to a high-frequency transmitting circuit through serial communication. This realizes a reduction in test time of the high-frequency transmitting circuit, enabling to test a semiconductor integrated circuit in a short time.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 9 is a flow chart showing a process of a method for testing the semiconductor integrated circuit according to the conventional semiconductor integrated circuit.

DESCRIPTION OF THE EMBODIMENTS

Referring to FIGS. 1 through 7, the following will describe one embodiment of the present invention.

First Embodiment

Figure 1:
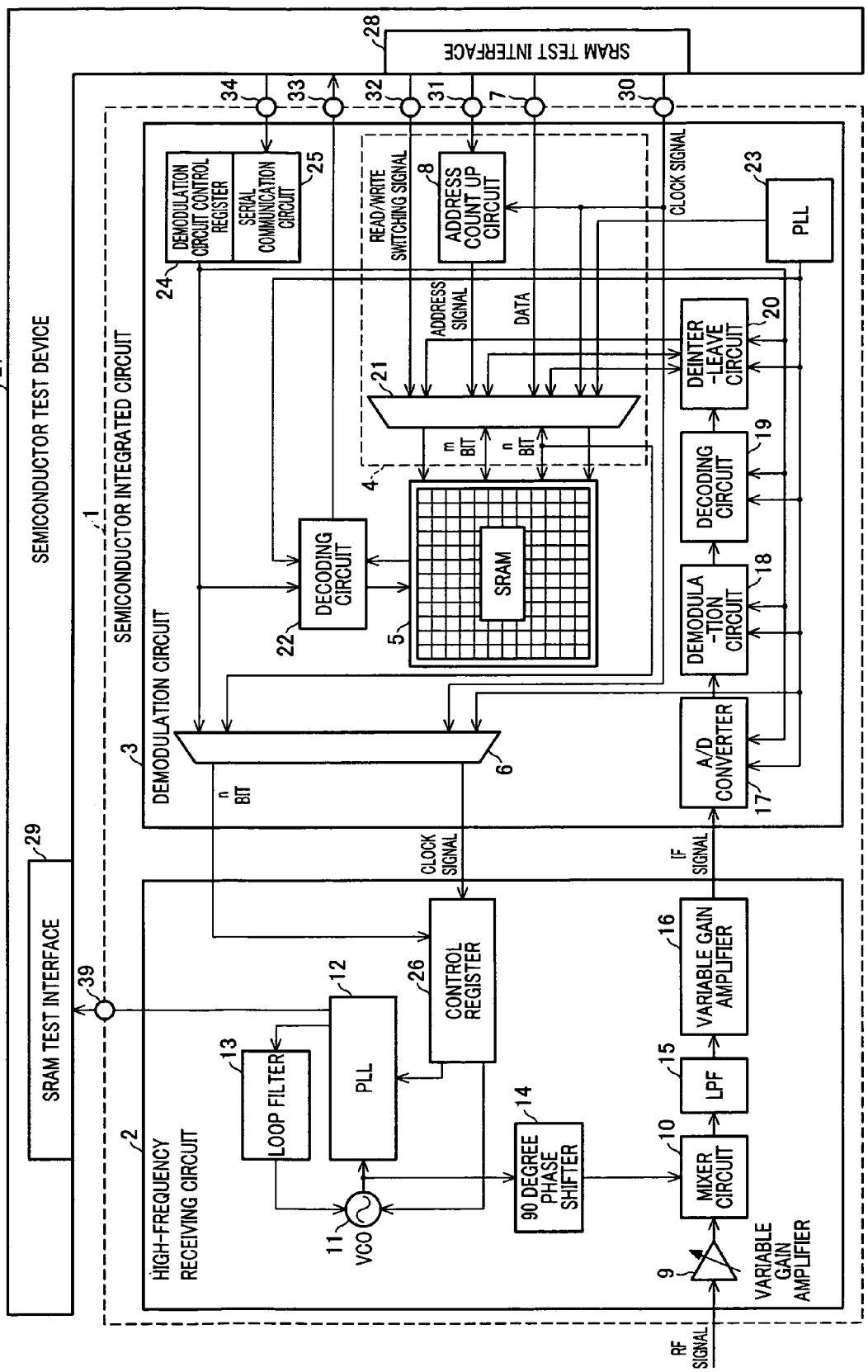
FIG. 1 is a block diagram illustrating a structure in which a semiconductor integrated circuit and a semiconductor test device are provided according to a first embodiment.

FIG. 1 is a block diagram illustrating a structure in which a semiconductor integrated circuit 1 and a semiconductor test device 27 are provided according to a first embodiment.

The semiconductor integrated circuit 1 includes a high-frequency receiving circuit 2 and a demodulation circuit 3. The high-frequency receiving circuit 2 includes a variable gain amplifier 9. The variable gain amplifier 9 amplifies an RF signal in the range between several 100 MHz and several GHz, and provides it to a mixer circuit 10.

The high-frequency receiving circuit 2 includes a VCO 11. The VCO 11 generates an oscillation signal that oscillates at a specific frequency, and provides the signal to a PLL 12 and a 90 degree phase shifter 14. The PLL circuit 12 locks a phase of the oscillation signal received from the VCO 11, and outputs the signal to a loop filter 13. The loop filter 13 receives the signal from the PLL 12, and outputs it to the VCO 11. The 90 degree phase shifter 14 shifts the phase of the oscillation signal received from the VCO 11 by 90 degrees, and provides it to the mixer circuit 10.

Based on the oscillation signal received from the 90 degree phase shifter 14, the mixer circuit 10 converts the RF signal received from the variable gain amplifier 9 to a signal having an IF signal in the range between a several MHz and several 10 MHz. Then, the mixer circuit 10 provides the signal thus converted to a low pass filter circuit (LPF) 15. The LPF 15 passes low-frequency components of the IF signal received from the mixer circuit 10 and provides them to a variable gain amplifier 16. The variable gain amplifier 16 amplifies the IF signal received from the LPF 15, and provides it to an A/D converter 17 in the demodulation circuit 3.

The A/D converter 17 converts the IF signal received from the variable gain amplifier 16 to a digital signal, and provides it to the demodulation circuit 18. The demodulation circuit 18 demodulates the digital IF signal received from the A/D converter 17 to a demodulated signal, and provides it to a decoding circuit 19. The decoding circuit 19 decodes the demodulated signal received from the demodulation circuit 18 to generate a decoded signal, and provides it to a deinterleave circuit 20.

The deinterleave circuit 20 rearranges the decoded signal data received from the decoding circuit 19 so as to break up sequential errors of the signal, and reconstructs correct data using an error correction technique. For this purpose, the deinterleave circuit 20 stores the decoded signal in an SRAM 5 via a selection circuit 21 provided in an SRAM control circuit 4.

The demodulation circuit 3 includes a decoding circuit 22. The decoding circuit 22 reads out from the SRAM 5 the decoded signal data, which is reconstructed into correct data by the deinterleave circuit 20 using the error correction technique. The decoding circuit 22 then decodes the decoded signal data thus read out, and outputs it to the semiconductor test device 27 via an output terminal 33.

The demodulation circuit 3 further includes a PLL 23. The PLL 23 outputs a control signal to the A/D converter 17, the demodulation circuit 18, the decoding circuit 19, the deinterleave circuit 20, the decoding circuit 22, and the selection circuit 21.

The semiconductor integrated circuit 1 has input terminals 32, 31, 7, and 30. In order to control an SRAM, generally, a read/write switching signal, an address signal having a width of M bit, and a data signal having a width of N bit are required. A read/write switching signal is supplied via the input terminal 32 from the SRAM test interface 28 provided in the semiconductor test device 27. The read/write switching signal is then provided to the SRAM 5 by the selection circuit 21. An address signal having a width of M bit is supplied via the input terminal 31 from the SRAM test interface 28 to an address count up circuit 8. The address count up circuit 8 provides the address signal to the selection circuit 21, and the selection circuit 21 provides the address signal to the SRAM 5.

Further, (i) test data for driving and testing the high-frequency receiving circuit 2 and (ii) a data signal having a width of N bit are supplied from the SRAM test interface 28 via the input terminal 7, and then provided to the SRAM 5 by the selection circuit 21.

The demodulation circuit 3 further includes a demodulation circuit control register 24 and a serial communication circuit 25. The demodulation circuit control register 24 transmits control data concerning: the A/D converter 17, the demodulation circuit 18, the decoding circuit 19, the interleave circuit 20, and the decoding circuit 22, which are provided in the demodulation circuit 3. The control data is transmitted by serial communication performed by the serial communication circuit 25.

The demodulation circuit 3 includes a test data transmitting circuit 6. The test data transmitting circuit 6 transmits test data read out from the SRAM 5 by the selection circuit 21 to the control register 26. Further, the test data transmitting circuit 6 receives a clock signal supplied from the SRAM test interface 28 via the input terminal 30, and provides it to the control register 26. The test data transmitting circuit 6 also receives a control signal from the PLL 23. Further, the test data transmitting circuit 6 receives a control signal from the control register 24, and provides it to the control register 26.

The control register 26 of the high-frequency receiving circuit 2 provides the VCO 11 and PLL 12 with the test data received from the test data transmitting circuit 6. The result of testing the VCO 11 and PLL 12 of the high-frequency receiving circuit 2 is supplied as a test result signal to the semiconductor test device 27 via a test result output terminal 39 provided in the semiconductor integrated circuit 1. Specifically, the test result signal is outputted from a phase comparator of the PLL 12 to an SRAM test interface 29 of the semiconductor test device 27 via the test result output terminal 39. The test result signal indicates whether or not the VCO 11 oscillates a signal at a specific frequency.

In order to control the SRAM 5, a read/write switching signal, an address signal having a width of M bit, and a data signal having a width of N bit are required. Generally, such signals are controlled by the deinterleave circuit 20. In the present embodiment, however, when the SRAM 5 and the high-frequency receiving circuit 2 are tested, the SRAM test interface 28 of the semiconductor test device 27 can directly control the read/write switching signal, the address signal having a width of M bit, and the data signal having a width of N bit, via input terminals 32, 31, 7, and 30 provided in the semiconductor integrated circuit 1. Further, the read/write switching signal, the address signal, and the data signal are selected by the selection circuit 21 for each test.

The control register 26 of the high-frequency receiving circuit 2 is constituted by a selection circuit. In the conventional configuration, test data to test the high-frequency receiving circuit 2 is provided to the control register 26 from the control register 24 of the demodulation circuit 3 which is supplied from the semiconductor test device 27 via the input terminal 34. In the present embodiment, however, test data to test the high-frequency receiving circuit 2 can be read out from the SRAM 5. Thus, when the high-frequency receiving circuit 2 is tested, the test data from the control register 24 and the test data read out from the SRAM 5, both provided to the test data transmitting circuit 6, are selectively provided to the control register 26.

The demodulation circuit 3 digitalizes and demodulates an IF signal outputted from the high-frequency receiving circuit 2 according to a specified system, and performs error correction on the IF signal. Then, the demodulation circuit 3 outputs the signal to a digital signal processor, provided in the subsequent stage of the semiconductor integrated circuit 1.

The deinterleave circuit 20 operates according to an interleave system, which is commonly used in transmitting and receiving devices. According to the interleave system, digital data is randomly rearranged on the transmitting end, and then the digital data is rearranged back to the original order on the receiving end, so that sequential errors can be broken up and correct data is reconstructed using an error correction technique. The deinterleave circuit 20 serves to rearrange received digital data, and commonly uses an SRAM as its work area. The storage capacity of the SRAM varies depending on which interleave system is employed. In the present embodiment, an SRAM which has conventionally been only tested is employed to transmit test data to test the high-frequency receiving circuit 2. This realizes a semiconductor integrated circuit capable of performing the test efficiently in a short time.

To solve the foregoing problems, in the present embodiment, when the high-frequency receiving circuit 2 is tested, the control register 26 is controlled based on test data of the high-frequency receiving circuit 2, which is transmitted via the SRAM control circuit 4, the SRAM 5, and the test data transmitting circuit 6, not based on test data transmitted via the serial communication circuit 25 and the demodulation circuit control register 24.

Commonly, SRAMs operate at a frequency ranging from several 10 MHz to several 100 MHz, which is equivalent to 1000 times the serial communication rate. Thus, it is possible to set the control register 26 of the high-frequency receiving circuit 2 to operate at a higher speed than conventional control registers. This reduces test time of the high-frequency receiving circuit 2.

Figure 2:
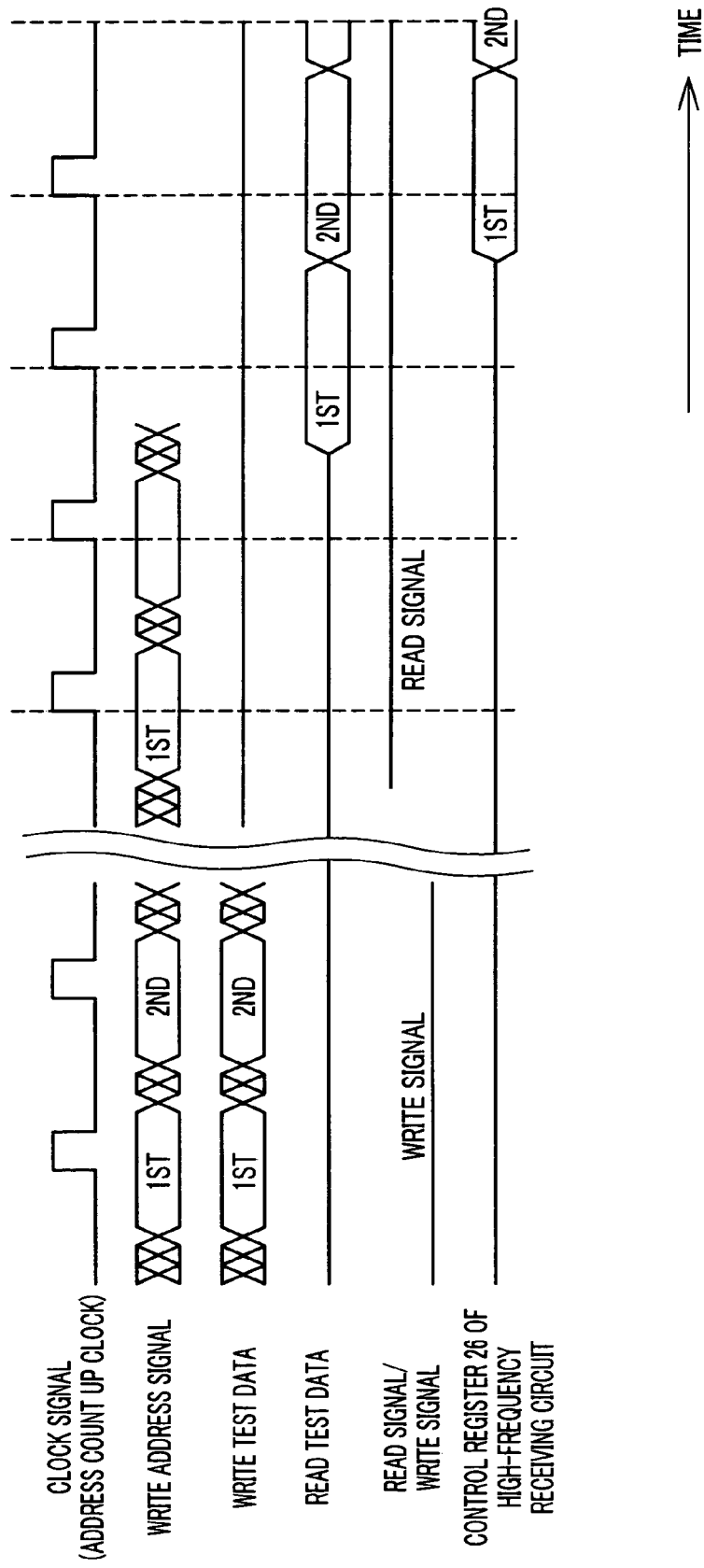
FIG. 2 is a timing chart representing operations of the semiconductor integrated circuit according to the first embodiment.
Figure 3:
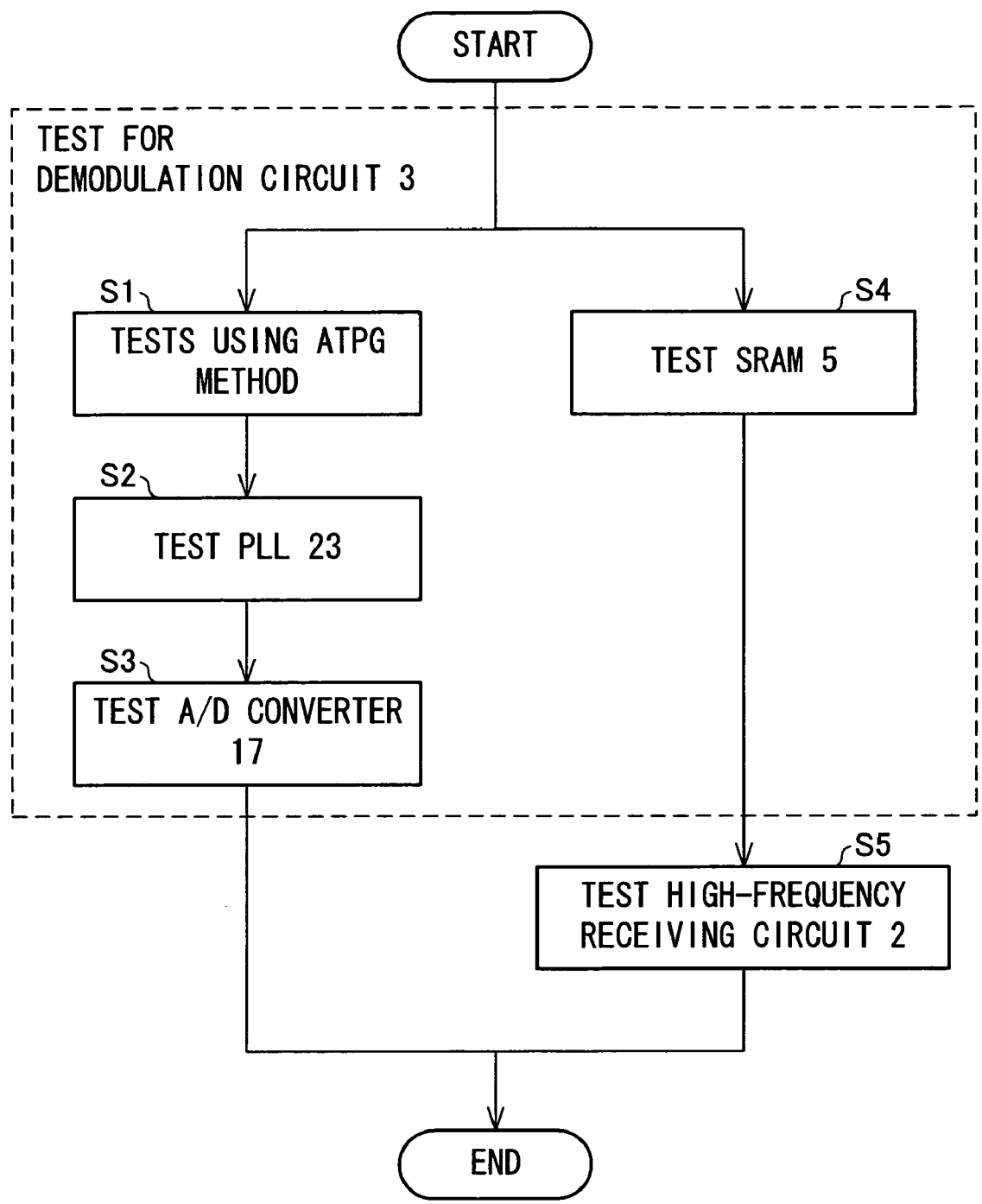
FIG. 3 is a flow chart showing a process of a method for testing the semiconductor integrated circuit according to the first embodiment.

FIG. 2 is a timing chart representing operations of the semiconductor integrated circuit 1. To start up the test for the SRAM 5, the input terminals 32, 31, 7, and 30 are connected to the SRAM test interface 28, via which the read/write switching signal, the address signal, the data signal, and the clock signal are supplied, respectively. This enables the test for the SRAM 5 to be performed based on a signal supplied from the SRAM test interface 28 of the semiconductor test device 27.

Then, a normal test for the SRAM 5 is performed. Commonly, a memory such as an SRAM is tested using dedicated test data that is created based on an algorithm specific to individual memory (step S4). In the present embodiment, since test data for testing a high-frequency receiving circuit is stored in the SRAM 5, the SRAM itself is first tested, and then test data to test the high-frequency receiving circuit is stored in the SRAM 5.

First, based on the signal supplied from the SRAM test interface 28, a counter of the address counter up circuit 8 is set to an initial address of the SRAM 5, concerning test data of the high-frequency receiving circuit. Then, test data and a write signal, which are to be written to the SRAM 5, are transmitted to the selection circuit 21 from the SRAM test interface 28 via the input terminals 7 and 32. Further, a clock signal is transmitted to the address count up circuit 8 via the input terminal 30, and a new count of the address count up circuit 8 is set to the next address. Then, the test data and the write signal both received from the SRAM test interface 28 are transmitted and written to the SRAM 5. Thereafter, test data of the high-frequency receiving circuit is repeatedly stored in the SRAM 5.

After all sets of test data of the high-frequency receiving circuit are stored in the SRAM 5, the count of the address count up circuit 8 is set to the initial address. Then, a read signal is transmitted from the SRAM test interface 28 to the SRAM 5 via the selection circuit 21. Accordingly, test data of the high-frequency receiving circuit, stored in the SRAM 5, is transmitted to the control register 26 of the high-frequency receiving circuit 2 via the test data transmitting circuit 6.

The control register 26 of the high-frequency receiving circuit 2 receives the test data from the test data transmitting circuit 6 in synchronization with a clock signal for driving the address count up circuit 8. Then, the control register 26 tests the high-frequency receiving circuit 2 by controlling each section of the high-frequency receiving circuit 2 (step S5). Finally, a test result signal (a signal from the phase comparator in the present embodiment) is outputted to the SRAM test interface 29.

The SRAM test interface 29 compares the test result signal with a preset expected value, so as to make determination. This allows the high-frequency receiving circuit 2 to be controlled without serial communication, enabling to reduce test time of the high-frequency receiving circuit 2.

While the SRAM 5 is tested, simultaneously, other logic circuits in the demodulation circuit 3 excluding the SRAM 5, the SRAM control circuit 4, and the test data transmitting circuit 6 are tested using the ATPG method (step Si). Further, a test for the PLL 23 (step S2) and then a test for the A/D converter 17 (step S3) are performed.

In recent years, the development of semiconductor test devices enables a test using an ATPG method (simply "ATPG method", hereinafter) and a test for an SRAM (simply "SRAM test", hereinafter) to be performed simultaneously. In transmitting and receiving devices, generally, an ATPG test takes more time than an SRAM test though it depends on the size of a circuit.

As described above, after the SRAM 5 is tested (step S4), test data of the high-frequency receiving circuit 2 is stored in the SRAM 5, and then the high-frequency receiving circuit 2 is tested (step S5). This enables the ATPG test for the demodulation circuit 3 (step S1) and the test for the high-frequency receiving circuit 2 (step S5) to be performed simultaneously, reducing overall test time of the semiconductor integrated circuit 1.

Second Embodiment

Figure 4:
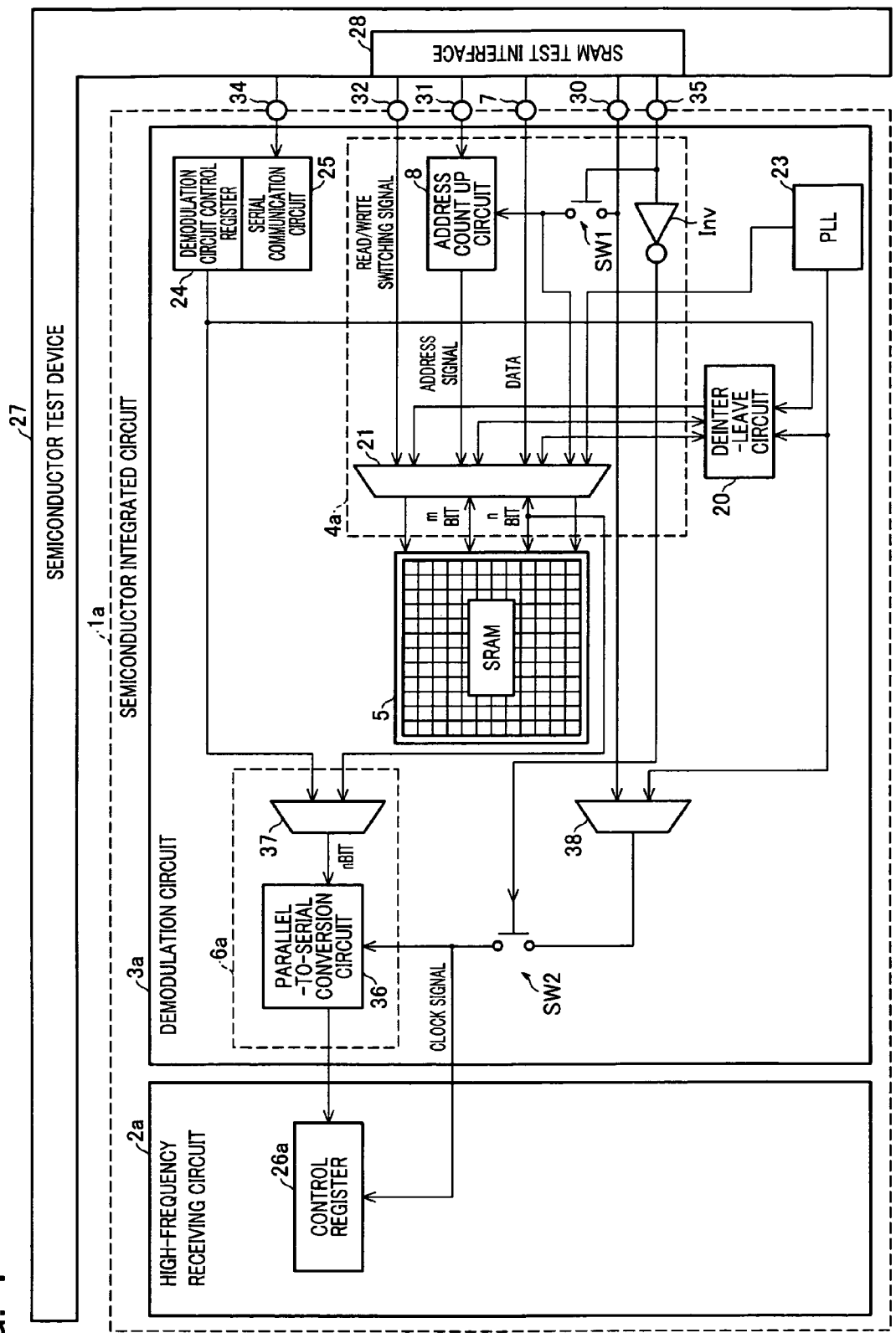
FIG. 4 is a block diagram illustrating a structure in which a semiconductor integrated circuit and a semiconductor test device are provided according to a second embodiment.

FIG. 4 is a block diagram illustrating a structure in which a semiconductor integrated circuit 1a and a semiconductor test device 27 are provided according to a second embodiment. Constituting elements being the same as those described in the foregoing are indicated by the same reference numerals, and their detailed explanations are omitted. Further, for simple illustration, constituting elements other than a control register 26a are omitted in a high-frequency receiving circuit 2a, and the A/D converter 17, the demodulation circuit 18, and the decoding circuit 19 are omitted in a demodulation circuit 3a.

The semiconductor integrated circuit 1a includes a high-frequency receiving circuit 2a and a demodulation circuit 3a. The demodulation circuit 3a includes a test data transmitting circuit 6a. The test data transmitting circuit 6a includes a parallel-to-serial conversion circuit 36. The parallel-to-serial conversion circuit 36 receives via a selection circuit 37 test data read out from the SRAM 5 as parallel data, converts it to serial data, and provides the serial data to a control register 26a of the high-frequency receiving circuit 2a. The selection circuit 37 selectively provides the parallel-to-serial conversion circuit 36 with either (i) test data read out from the SRAM 5 or (ii) a control signal received from a control register 24.

The demodulation circuit 3a includes a selection circuit 38. The selection circuit 38 selectively provides a switch SW2 with either (i) a clock signal received via an input terminal 30 from an SRAM test interface 28 of a semiconductor test device 27 or (ii) a clock signal generated by a PLL 23. Further, the switch SW2 provides, according to a clock control signal supplied via an input terminal 35 from the SRAM test interface 28 and inverted by an inverter Inv, a clock signal received from the selection circuit 38 to the parallel-to-serial conversion circuit 36 and the control register 26a.

The demodulation circuit 3a includes an SRAM control circuit 4a having a switch SW1. The switch SW1 provides, according to a clock control signal supplied via the input terminal 35 from the SRAM test interface 28, a clock signal supplied via the input terminal 30 from the SRAM test interface 28 to an address count up circuit 8 and a selection circuit 21.

Generally, an SRAM receives or outputs parallel data having a width of n bit. Since a control register provided in a high-frequency receiving circuit may be constituted by shift registers, the parallel-to-serial conversion circuit 36 is provided, so that parallel data read out from the SRAM 5 can be converted to serial data. In this case, the parallel-to-serial conversion circuit 36 is driven, based on a clock signal for driving the address count up circuit 8.

Figure 5:
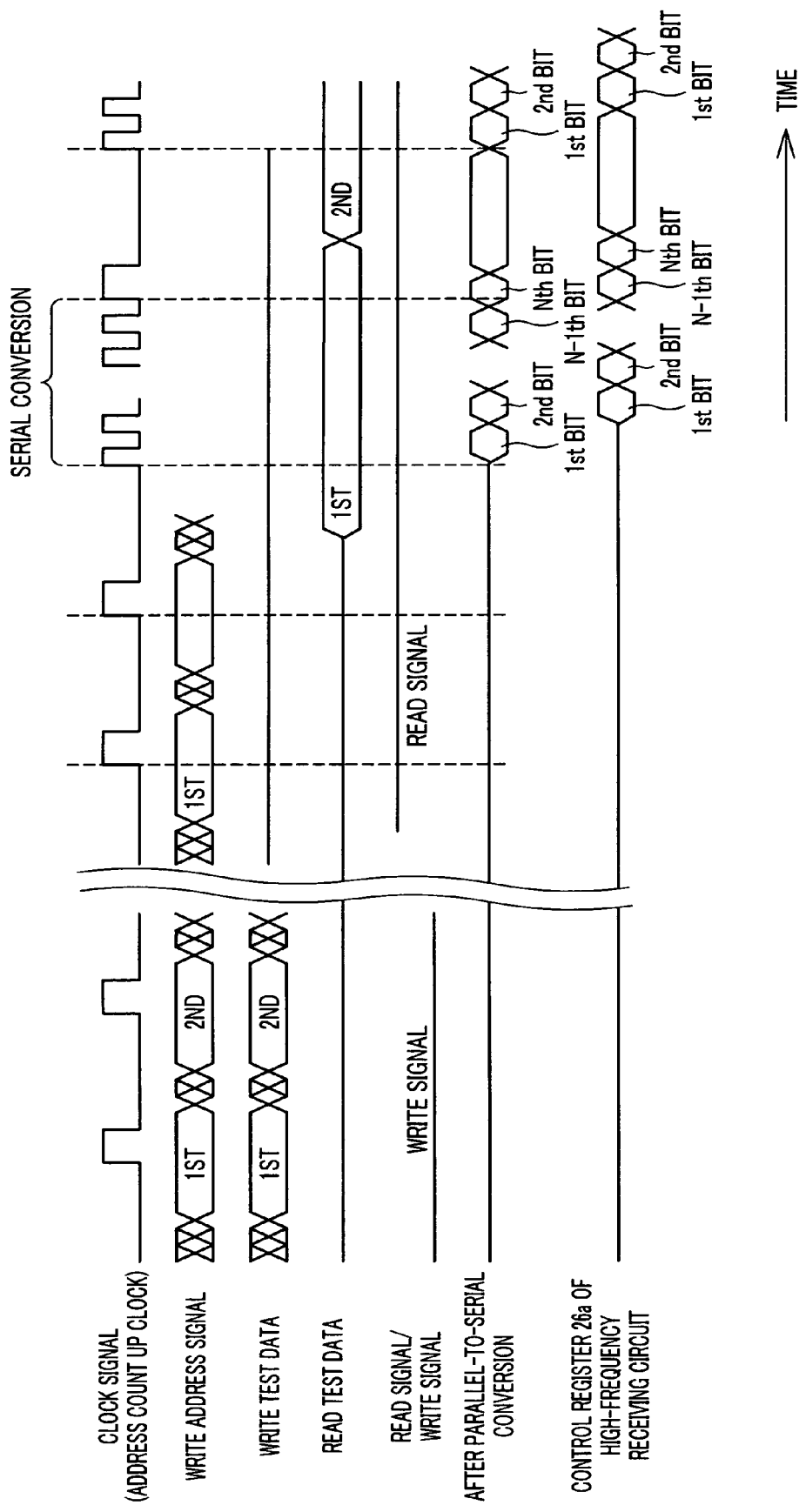
FIG. 5 is a timing chart representing operations of the semiconductor integrated circuit according to the second embodiment.

FIG. 5 is a timing chart representing operations of the semiconductor integrated circuit 1a. To start up the test for the SRAM 5, the input terminals 32, 31, 7, 30, and 35 are connected to the SRAM test interface 28, via which the read/write switching signal, the address signal, the data signal, and the clock signal are supplied, respectively. This enables the SRAM 5 to be tested based on a signal supplied from the SRAM test interface 28 of the semiconductor test device 27. Then, a normal test for the SRAM 5 is performed, and test data of the high-frequency receiving circuit 2a is stored in the SRAM 5.

Further, based on the signal supplied from the SRAM test interface 28, a counter of the address counter up circuit 8 is set to an initial address of the SRAM 5, concerning test data of the high-frequency receiving circuit. Then, test data and a write signal, which are to be written to the SRAM 5, are transmitted to the selection circuit 21 from the SRAM test interface 28. Further, a clock signal is transmitted to the address count up circuit 8, and a new count of the address count up circuit 8 is set to the next address.

Here, in order to disable the parallel-to-serial conversion circuit 36, the clock signal for driving the parallel-to-serial conversion circuit 36 is stopped by switching off the switch SW2. Then, test data and write signal are transmitted from the SRAM test interface 28 and written to the SRAM 5. Thereafter, test data of the high-frequency receiving circuit is repeatedly stored in the SRAM 5.

After all sets of test data of the high-frequency receiving circuit are stored in the SRAM 5, the count of the address count up circuit 8 is set to the initial address. Then, a read signal is transmitted from the SRAM test interface 28 to the SRAM 5. Accordingly, test data of the high-frequency receiving circuit, stored in the SRAM 5, is transmitted to the parallel-to-serial conversion circuit 36 of the test data transmitting circuit 6a; Here, the switch SW1 for providing a clock signal to the address count up circuit 8 is switched off to stop providing a clock signal, and the switch SW2 for providing a clock signal to the parallel-to-serial conversion circuit 36 is switched on to provide a clock signal to the parallel-to-serial conversion circuit 36.

In the second embodiment, parallel data having a width of n bit needs to be converted to serial data. Thus, n clock pulses are inputted in order to convert parallel data to serial data. At the same time, test data thus converted to serial data is written to the control register of 26a, constituted by shift registers and provided in the high-frequency receiving circuit 2a.

Therefore, each section of the high-frequency receiving circuit 2a is controlled with the test data received from the test data transmitting circuit 6a. Then, a test result signal (a signal from a phase comparator in the present embodiment) is outputted to the SRAM test interface 28. The SRAM test interface 28 compares the test result signal with a preset expected value, so as to make determination. This allows the high-frequency receiving circuit 2a to be controlled without serial communication, reducing the test time of the high-frequency receiving circuit 2a.

On the other hand, commonly, other logic circuits in the demodulation circuit 3 excluding the SRAM 5, the SRAM control circuit 4, and the test data transmitting circuit 6 are tested using the ATPG method. In recent years, the development of semiconductor test devices enables an ATPG test and an SRAM test to be performed simultaneously. In transmitting and receiving devices, generally, an ATPG test takes more time than a test for an SRAM though it depends on the size of a circuit.

As described above, after the SRAM 5 is tested, test data of the high-frequency receiving circuit 2a is stored in the SRAM 5, and then the high-frequency receiving circuit 2a is tested. This enables the ATPG test for the demodulation circuit 3a and the test for the high-frequency receiving circuit 2a to be performed simultaneously, reducing overall test time of the semiconductor integrated circuit 1a.

Third Embodiment

Figure 6:
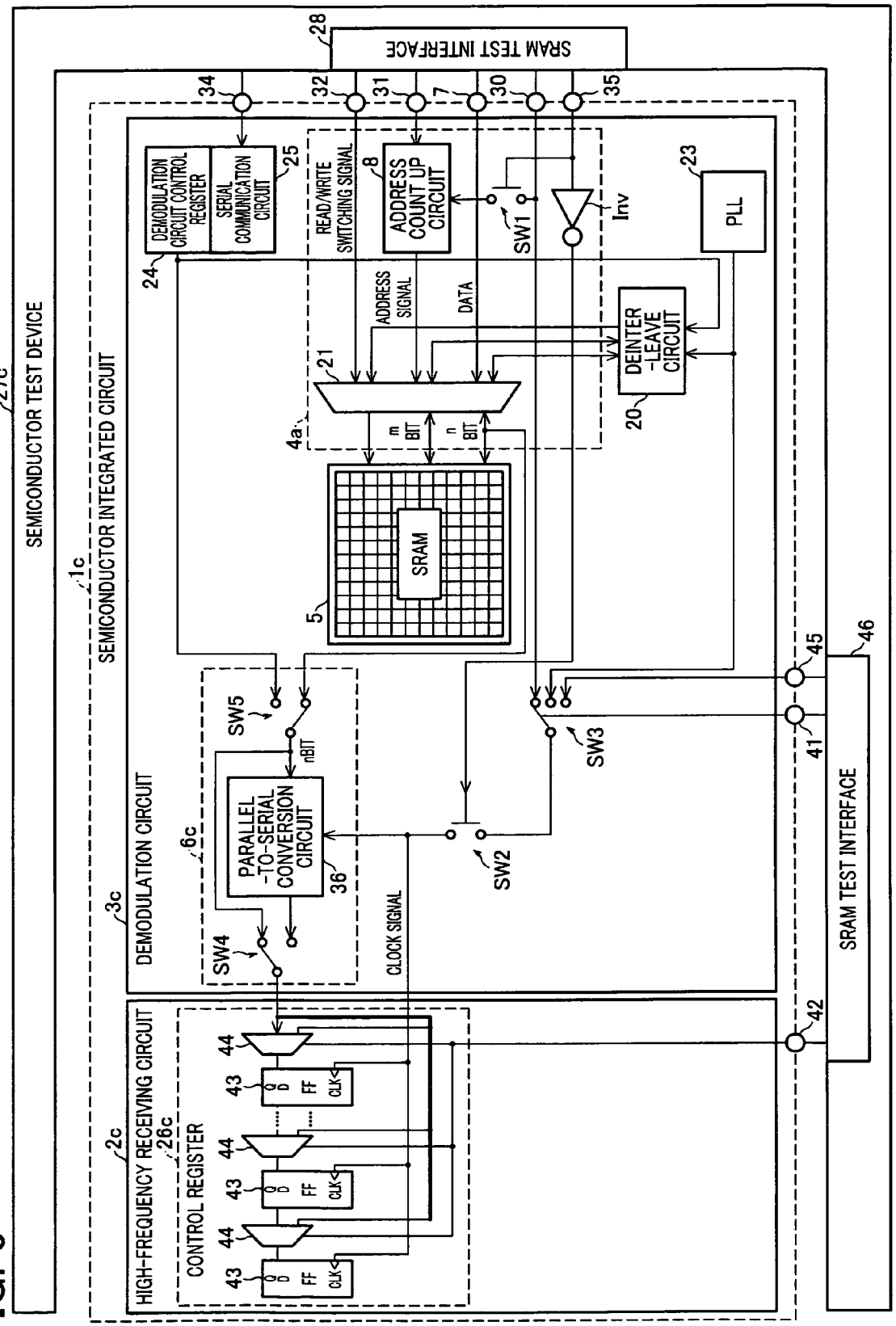
FIG. 6 is a block diagram illustrating a structure in which a semiconductor integrated circuit and a semiconductor test device are provided according to a third embodiment.

FIG. 6 is a block diagram illustrating a structure in which a semiconductor integrated circuit 1c and a semiconductor test device 27c are provided according to a third embodiment. Constituting elements being the same as those described in the foregoing are indicated by the same reference numerals, and their detailed explanations are omitted. Further, for simple illustration, as is the case with FIG. 4, constituting elements other than a control register 26c are omitted in a high-frequency receiving circuit 2c, and the A/D converter 17, the demodulation circuit 18, and the decoding circuit 19 are omitted in a demodulation circuit 3c.

The demodulation circuit 3c includes a test data transmitting circuit 6c. The test data transmitting circuit 6c includes a parallel-to-serial conversion circuit 36. In the preceding stage of the parallel-to-serial conversion circuit 36, a selection switch SW5 is provided. The selection switch SW5 selectively provides the parallel-to-serial conversion circuit 36 with either a signal read out from the SRAM 5 or a signal received from the demodulation circuit control register 24.

In the subsequent stage of the parallel-to-serial conversion circuit 36, a selection switch SW4 is provided. The selection switch SW 4 selectively provides a control register 26c with either an output from the parallel-to-serial conversion circuit 36 or an input to the parallel-to-serial conversion circuit 36, based on a selection signal provided to a selection signal input terminal (not shown). Note that, the selection switch SW4 may make the selection based on a selection signal read out from the SRAM 5, instead of the selection signal supplied via the selection signal input terminal (not shown).

The demodulation circuit 3c includes a selection switch SW3. The selection switch SW3 selectively provides the selection switch SW2 with any one of (i) a clock signal, supplied via an input terminal 30 from the SRAM test interface 28, for driving the parallel-to-serial conversion circuit 36, (ii) a clock signal generated by a PLL 23, and (iii) a clock signal supplied via an input terminal 45 from the SRAM test interface 46. The selection switch SW3 makes the selection based on a clock selection signal for driving the parallel-to-serial conversion circuit 36, which is supplied via an input terminal 41 from the SRAM test interface 46.

Note that, the clock selection signal for driving the parallel-to-serial conversion circuit 36 may be supplied from the SRAM 5, not via the input terminal 41.

The high-frequency receiving circuit 2c includes a control register 26c. The control register 26c includes a plurality of flip-flop circuits 43 and a plurality of register circuits 44, which are alternately disposed and connected to each other. Each of the flip-flop circuits 43 receives a clock signal from the selection switch SW2, according to an input control signal supplied via an input terminal 35. Each of the register circuits 44 receives a selection signal supplied from the SRAM test interface 46 via the input terminal 42. Further, each of the register circuits 44 receives test data read out as parallel data from the SRAM 5 and transmitted through the selection switches SW5, SW4, not through the parallel-to-serial conversion circuit 36. Note that, each of the register circuits 44 may receive a selection signal read out from the SRAM 5, instead of the selection signal supplied via the input terminal 42.

In the third embodiment, the selection switch SW4 is provided so that both the first and second embodiments are applicable. A clock selection signal to be selected by the selection switch SW3 may be supplied from an SRAM or via a dedicated input terminal provided separately. In the present embodiment, the foregoing described the case where the dedicated input terminal 41 is provided.

When a high-frequency receiving circuit and a demodulation circuit are designed as a single design group, commonly, methods and timings for testing the respective circuits need to be taken into account. However, in the case where a high-frequency receiving circuit and a demodulation circuit are designed as plural design groups, e.g. separate groups, test methods and test timings may not conform to each other. Even in such a case, with alternatives provided in the present embodiment, it is possible to flexibly test a semiconductor integrated circuit. Regarding functions and test methods of the circuits, detailed descriptions are omitted here since they are described in the first and second embodiments.

Figure 7:
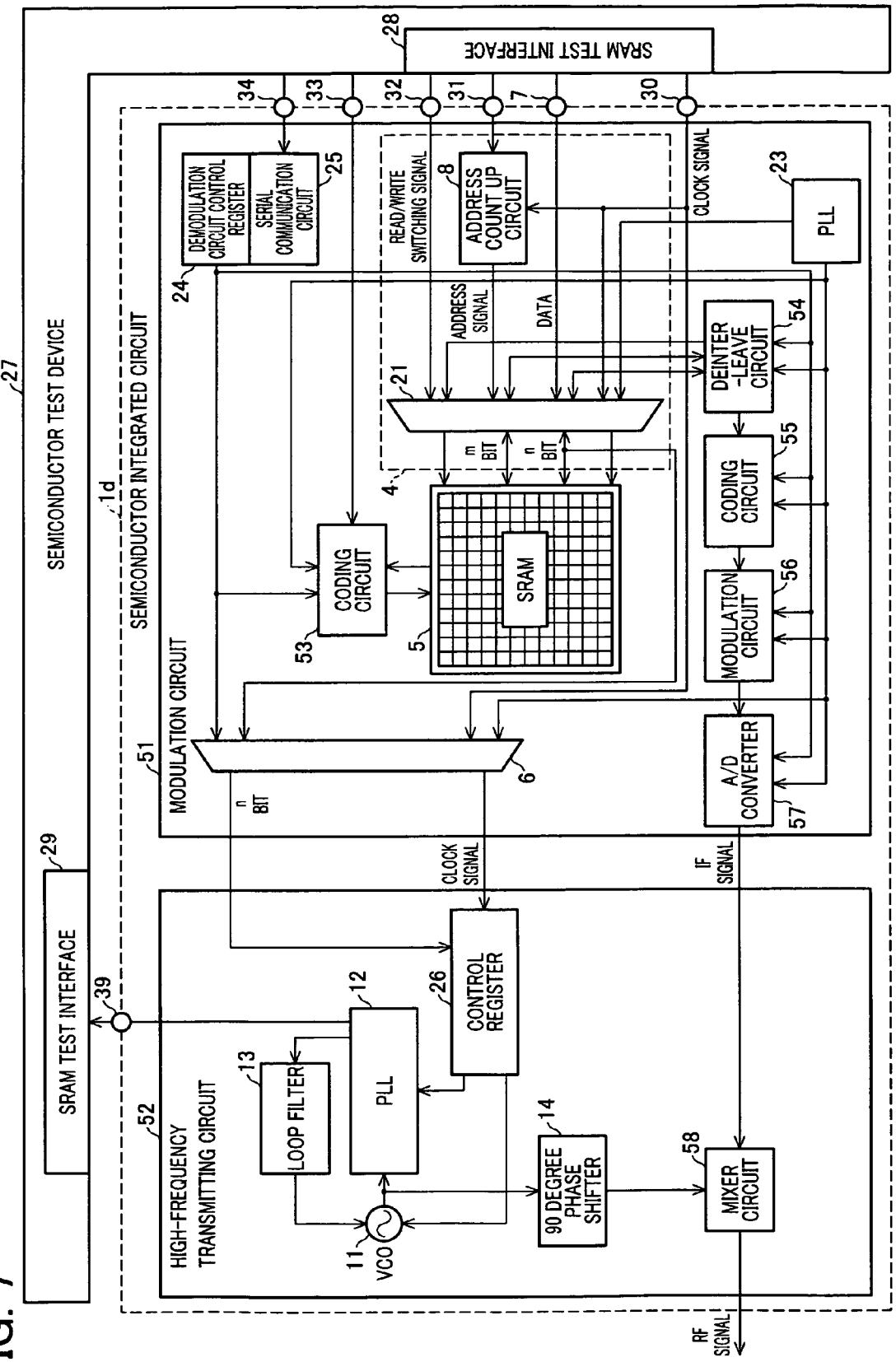
FIG. 7 is a block diagram illustrating another structure in which a semiconductor integrated circuit and a semiconductor test device are provided according to the third embodiment.
Figure 8:
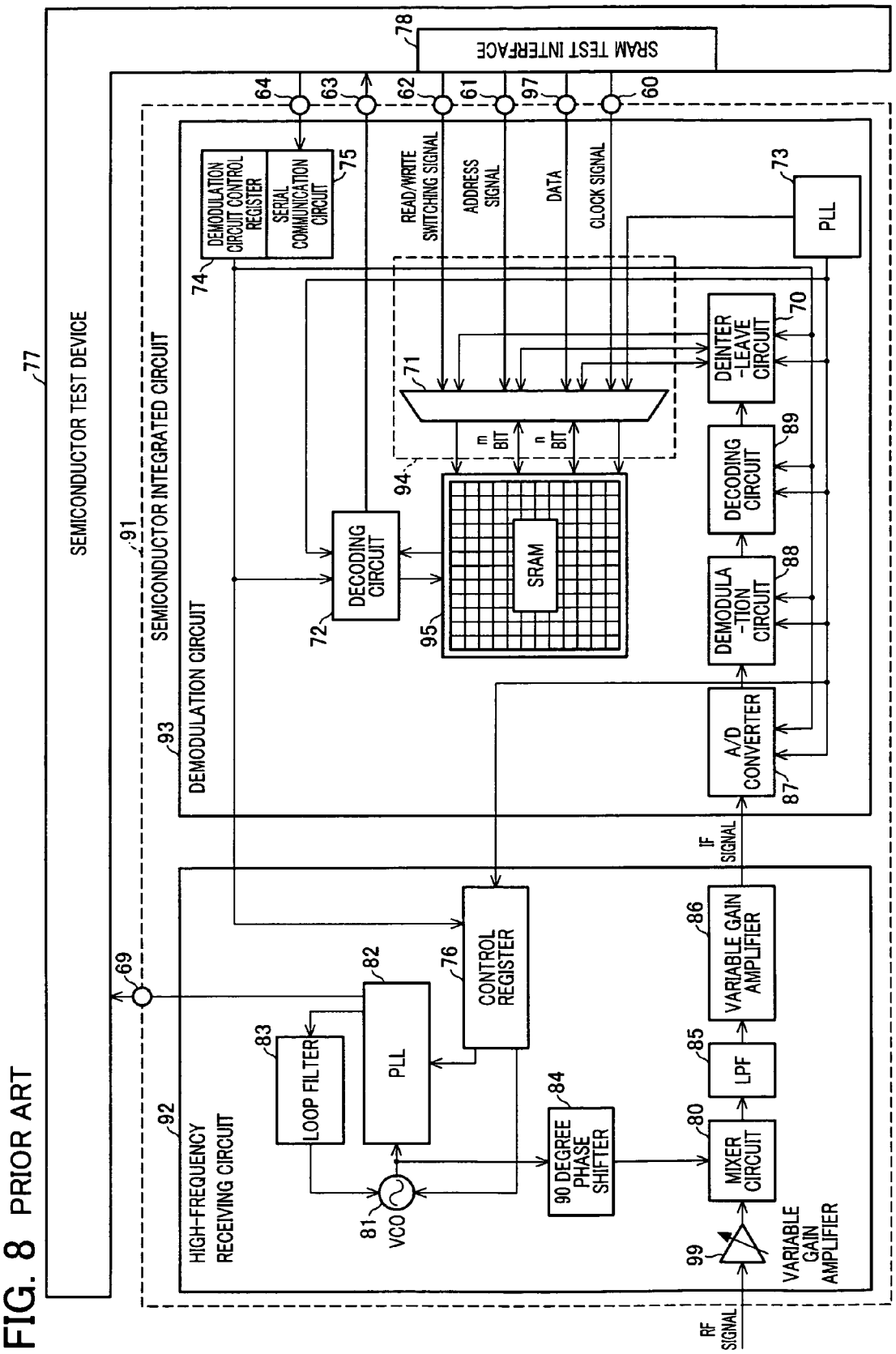
FIG. 8 is a block diagram illustrating a structure in which a conventional semiconductor integrated circuit and a conventional semiconductor test device are provided.

Note that, the first to third embodiments describe the case of a semiconductor integrated circuit incorporating a high-frequency receiving circuit and a demodulation circuit. However, the present invention is not limited to this. The present invention may be applied to semiconductor integrated circuits incorporating a modulation circuit and a high-frequency transmitting circuit. In this case, only the direction of signal flow is changed, i.e., from a modulation circuit to a high-frequency transmitting circuit, and other factors such as circuit configurations and test methods are the same as those described in the foregoing. FIG. 7 is a block diagram illustrating another structure in which a semiconductor integrated circuit 1d and a semiconductor test device 27 are provided according to the third embodiment. Constituting elements being the same as those described in the foregoing are indicated by the same reference numerals, and their detailed descriptions are omitted. The semiconductor integrated circuit 1d includes a modulation circuit 51 and a high-frequency transmitting circuit 52. The modulation circuit 51 includes a coding circuit 53, a deinterleave circuit 54, a coding circuit 55, a modulation circuit 56, and an A/D converter 57. The high-frequency transmitting circuit 52 includes a mixer circuit 58. A transmission signal supplied via an input terminal 33 is coded by the coding circuit 53 and stored in an SRAM 5. Then, the transmission signal is read out by a selection circuit 21, and transmitted to the mixer circuit 58 as an IF signal through the deinterleave circuit 54, the coding circuit 55, the modulation circuit 56, and the A/D converter 57. Further, the transmission signal undergoes frequency conversion in the mixer circuit 58, and transmitted as an RF signal from the high-frequency transmitting circuit 52 to the outside. The present invention may be applied to such a semiconductor integrated circuit 1d incorporating the modulation circuit 51 and the high-frequency transmitting circuit 52.

The present invention is not limited to the description of the embodiments above, but may be altered within the scope of the claims. An embodiment based on a proper combination of technical means disclosed in different embodiments is encompassed in the technical scope of the present invention.

The present invention may be applied to (i) a semiconductor integrated circuit incorporating a high-frequency receiving circuit and a demodulation circuit, (ii) a semiconductor integrated circuit incorporating a high-frequency transmitting circuit and a modulation circuit, and (iii) test methods thereof.

It is preferable that a semiconductor integrated circuit of the present embodiments include a test data input terminal via which the test data is supplied from the semiconductor test device.

According to the arrangement, the data can be provided from the semiconductor test device directly to the SRAM via the test data input terminal. This enables the semiconductor integrated circuit to be tested easily in a short time.

In the semiconductor integrated circuit of the present embodiments, it is preferable that the test data read out from the SRAM by the test data transmitting circuit be parallel data, and that the parallel data be transmitted by the test data transmitting circuit to the high-frequency receiving circuit.

According to the arrangement, the test data read out from the SRAM, which commonly receives and outputs parallel data having a width of n bit, is transmitted to the high-frequency receiving circuit without being converted. This enables the test data to be transmitted to the high-frequency receiving circuit at a high speed with a simple configuration.

In the semiconductor integrated circuit of the present embodiments, preferably, the test data read out from the SRAM is parallel data, the parallel data is converted into serial data by the test data transmitting circuit, and the serial data is transmitted by the test data transmitting circuit to the high-frequency receiving circuit.

According to the arrangement, the test data can be transmitted to a control register of the high-frequency receiving circuit constituted by a shift register.

In the semiconductor integrated circuit of the present embodiments, it is preferable that the test data transmitting circuit be driven by a clock signal for driving the SRAM.

According to the arrangement, the test data can be transmitted to the high-frequency receiving circuit in synchronization with operation timing of the SRAM. This enables the test data to be transmitted to the high-frequency receiving circuit at a high speed.

It is preferable that the semiconductor integrated circuit of the present embodiments include an SRAM clock input terminal, via which an SRAM clock signal for driving the SRAM is supplied; and a transmitting circuit clock signal input terminal, via which a transmitting circuit clock signal for driving the test data transmitting circuit is supplied.

According to the arrangement, the dedicated transmitting circuit clock signal input terminal, via which a transmitting circuit clock signal is supplied, is provided separately from the SRAM clock input terminal. This makes it possible to adjust the speed of transmitting the test data to the high-frequency receiving circuit by the dedicated transmitting circuit clock signal.

In the semiconductor integrated circuit of the present embodiments, it is preferable that the demodulation circuit include a selection circuit, the selection circuit selectively providing the test data transmitting circuit with either the SRAM clock signal supplied via the SRAM clock input terminal, or the transmitting circuit clock signal supplied via the transmitting circuit clock signal input terminal.

According to the arrangement, the SRAM clock signal or the transmitting circuit clock signal can be selected according to methods and timings for testing the high-frequency receiving circuit and the demodulation circuit.

It is preferable that the semiconductor integrated circuit of the present embodiments further include a selection signal input terminal, via which a selection signal is supplied, the selection signal being used to select either the SRAM clock signal or the transmitting circuit clock signal, the selection circuit selecting either the SRAM clock signal or the transmitting circuit clock signal, in response to the selection signal supplied via the selection signal input terminal.

According to the arrangement, it is possible to select the SRAM clock signal or the transmitting circuit clock signal based on the externally supplied selection signal, according to methods and timings for testing the high-frequency receiving circuit and the demodulation circuit.

In the semiconductor integrated circuit of the present embodiments, it is preferable that a selection signal, used to select either the SRAM clock signal or the transmitting circuit clock signal, be read out from the SRAM, and that the selection circuit select either the SRAM clock signal or the transmitting circuit clock signal, in response to the selection signal thus read out from the SRAM.

According to the arrangement, it is possible to select the SRAM clock signal or the transmitting circuit clock signal, based on a selection signal supplied from the semiconductor test device and stored in the SRAM.

In the semiconductor integrated circuit of the present embodiments, it is preferable that the demodulation circuit further include a selection circuit, the selection circuit selectively providing the high-frequency receiving circuit with either parallel test data read out as parallel data from the SRAM, or serial test data obtained by converting data which has been read out as parallel data from the SRAM into serial data.

According to the arrangement, it is possible to select the parallel test data or the serial test data, according to the configuration of a control register of the high-frequency receiving circuit.

It is preferable that the semiconductor integrated circuit of the present embodiments further include a selection signal input terminal, via which a selection signal is supplied, the selection signal being used to select either the parallel test data or the serial test data, the selection circuit selecting either the parallel test data or the serial test data, in response to the selection signal supplied via the input terminal.

According to the arrangement, it is possible to select the parallel test data or the serial test data, based on an externally supplied selection signal.

In the semiconductor integrated circuit of the present embodiments, it is preferable that a selection signal, used to select either the parallel test data or the serial test data, be read out from the SRAM, and that the selection circuit select either the parallel test data or the serial test data, in response to the selection signal thus read out from the SRAM.

According to the arrangement, it is possible to select the parallel test data or the serial test data, based on a selection signal supplied via the semiconductor test device and stored in the SRAM.

In the semiconductor integrated circuit of the present embodiments, it is preferable that the high-frequency receiving circuit include a control register for controlling operation of the high-frequency receiving circuit, and that the control resister be configured to receive, as parallel data, the test data transmitted by the test data transmitting circuit.

According to the arrangement, it is possible to receive test data just read out as parallel data from the SRAM, which commonly receives or outputs parallel data having a width of n bit. This enables the high-frequency receiving circuit to be tested at a high speed with a simple configuration.

In the semiconductor integrated circuit of the present embodiments, it is preferable that the high-frequency receiving circuit include a control register for controlling operation of the high-frequency receiving circuit, and that the control register be configured as a shift register to receive, as serial data, the test data transmitted from the test data transmitting circuit.

According to the arrangement, test data read out as parallel data from the SRAM is converted to serial data, and the control register receives the serial data. This enables the high-frequency receiving circuit to be tested at a high speed.

In the semiconductor integrated circuit of the present embodiments, preferably, the high-frequency receiving circuit includes a control register for controlling operation of the high frequency receiving circuit, the control register goes into either a parallel configuration mode to receive the test data transmitted from the test data transmitting circuit as parallel data, or a shift register configuration mode to receive the test data transmitted from the test data transmitting circuit as serial data, and the control register selects either the parallel configuration mode or the shift register configuration mode.

According to the arrangement, it is possible to test the high-frequency receiving circuit including the control register capable of functioning in both the parallel configuration mode and the shift register configuration mode.

It is preferable that the semiconductor integrated circuit of the present embodiments include a selection signal input terminal, via which a selection signal is supplied, the selection signal being used to select either the parallel configuration mode or the shift register configuration mode, the control register selecting either the parallel configuration mode or the shift register configuration mode, based on the selection signal supplied via the input terminal.

According to the arrangement, it is possible to select either the parallel configuration mode or the shift register configuration mode, based on an externally supplied selection signal.

In the semiconductor integrated circuit of the present embodiments, it is preferable that a selection signal, used to select the parallel configuration mode or the shift register configuration mode, be read out from the SRAM, and that the control register select either the parallel configuration mode or the shift register configuration mode, in response to the selection signal thus read out from the SRAM.

According to the arrangement, it is possible to select either the parallel configuration mode or the shift register configuration mode, based on a selection signal supplied from the semiconductor test device and stored in the SRAM.

It is preferable that the semiconductor integrated circuit of the present embodiments further include a test result output terminal, via which a test result based on the test data of the high-frequency receiving circuit is outputted to the semiconductor test device.

According to the arrangement, it is possible to compare the test result with an expected value preset in the semiconductor test device, so as to determine whether the test result is good or bad.

In the semiconductor integrated circuit of the present embodiments, it is preferable that the write circuit control the SRAM, in response to the SRAM control signal, received from the semiconductor test device, for controlling the SRAM.

According to the arrangement, it is possible to store test data for driving and testing the high-frequency receiving circuit in the SRAM by the write circuit, after the SRAM is controlled and tested.

In the semiconductor integrated circuit of the present embodiments, it is preferable that the write circuit include an address count up circuit, provided for controlling the SRAM.

According to the arrangement, an address written to or read out from the SRAM can be controlled with a simple configuration.

In a method for testing a semiconductor integrated circuit of the present embodiments, preferably, before storing the test data into the SRAM, (a) a test for the SRAM and (b) a test for the demodulation circuit using an ATPG method are started; the test data is stored in the SRAM, after the test for the SRAM is completed; and both a test for the high-frequency receiving circuit based on the test data, and the test for the demodulation circuit using the ATPG method are simultaneously performed.

According to the arrangement, test data is stored in the SRAM after the test for the SRAM is completed, and the test data is read out from the SRAM and transmitted to the high-frequency receiving circuit. This makes it possible to simultaneously perform, both the test for the high-frequency receiving circuit based on the test data and the test for the demodulation circuit using the ATPG method. This further reduces the test time of the semiconductor integrated circuit.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor integrated circuit, comprising:
    a high-frequency receiving circuit for receiving a high-frequency signal; and
    a demodulation circuit for demodulating a signal from said high-frequency receiving circuit, said demodulation circuit including a Static Random Access Memory (SRAM), said semiconductor integrated circuit being constituted by one or more semiconductor chips,
    said demodulation circuit, further including:
    a write circuit for receiving, from a semiconductor test device, test data for driving and testing said high-frequency receiving circuit so as to write the test data into the SRAM; and
    a test data transmitting circuit for reading out the test data from the SRAM, and for transmitting the test data which has been read out to said high-frequency receiving circuit.

2. The semiconductor integrated circuit according to claim 1, further comprising a test data input terminal, via which the test data is supplied from the semiconductor test device.

3. The semiconductor integrated circuit according to claim 1, wherein the test data read out from the SRAM by the test data transmitting circuit is parallel data, and the parallel data is transmitted by the test data transmitting circuit to said high-frequency receiving circuit.

4. The semiconductor integrated circuit according to claim 1, wherein the test data read out from the SRAM is parallel data, the parallel data is converted into serial data by the test data transmitting circuit, and the serial data is transmitted by the test data transmitting circuit to said high-frequency receiving circuit.

5. The semiconductor integrated circuit according to claim 1, wherein the test data transmitting circuit is driven by a clock signal for driving the SRAM.

6. The semiconductor integrated circuit according to claim 1, comprising:
    an SRAM clock input terminal, via which an SRAM clock signal for driving the SRAM is supplied; and
    a transmitting circuit clock signal input terminal, via which a transmitting circuit clock signal for driving the test data transmitting circuit is supplied.

7. The semiconductor integrated circuit according to claim 6, wherein said demodulation circuit includes a selection circuit, the selection circuit selectively providing the test data transmitting circuit with either the SRAM clock signal supplied via the SRAM clock input terminal, or the transmitting circuit clock signal supplied via the transmitting circuit clock signal input terminal.

8. The semiconductor integrated circuit according to claim 7, further comprising a selection signal input terminal, via which a selection signal is supplied, the selection signal being used to select either the SRAM clock signal or the transmitting circuit clock signal,
    the selection circuit selecting either the SRAM clock signal or the transmitting circuit clock signal, in response to the selection signal supplied via the selection signal input terminal.

9. The semiconductor integrated circuit according to claim 7, wherein
    a selection signal, used to select either the SRAM clock signal or the transmitting circuit clock signal, is read out from the SRAM, and
    the selection circuit selects either the SRAM clock signal or the transmitting circuit clock signal, in response to the selection signal thus read out from the SRAM.

10. The semiconductor integrated circuit according to claim 1, wherein said demodulation circuit further includes a selection circuit, the selection circuit selectively providing said high-frequency receiving circuit with either parallel test data read out as parallel data from the SRAM, or serial test data obtained by converting data which has been read out as parallel data from the SRAM into serial data.

11. The semiconductor integrated circuit according to claim 10, further comprising a selection signal input terminal, via which a selection signal is supplied, the selection signal being used to select either the parallel test data or the serial test data, the selection circuit selecting either the parallel test data or the serial test data, in response to the selection signal supplied via the selection signal input terminal.

12. The semiconductor integrated circuit according to claim 10, wherein
    a selection signal, used to select either the parallel test data or the serial test data, is read out from the SRAM, and
    the selection circuit selects either the parallel test data or the serial test data, in response to the selection signal thus read out from the SRAM.

13. The semiconductor integrated circuit according to claim 1, wherein
    said high-frequency receiving circuit includes a control register for controlling operation of said high-frequency receiving circuit, and
    the control resister is configured to receive, as parallel data, the test data transmitted by the test data transmitting circuit.

14. The semiconductor integrated circuit according to claim 1, wherein
    said high-frequency receiving circuit includes a control register for controlling operation of said high-frequency receiving circuit, and the control register is configured as a shift register to receive, as serial data, the test data transmitted from the test data transmitting circuit.

15. The semiconductor integrated circuit according to claim 1, wherein
said high-frequency receiving circuit includes a control register for controlling operation of said high frequency receiving circuit,
the control register goes into either a parallel configuration mode to receive the test data transmitted from the test data transmitting circuit as parallel data, or a shift register configuration mode to receive the test data transmitted from the test data transmitting circuit as serial data, and the control register selects either the parallel configuration mode or the shift register configuration mode.

16. The semiconductor integrated circuit according to claim 15, further comprising,
a selection signal input terminal, via which a selection signal is supplied, the selection signal being used to select either the parallel configuration mode or the shift register configuration mode,
the control register selecting either the parallel configuration mode or the shift register configuration mode, based on the selection signal supplied via the input terminal.

17. The semiconductor integrated circuit according to claim 15, wherein
a selection signal, used to select the parallel configuration mode or the shift register configuration mode, is read out from the SRAM, and
the control register selects either the parallel configuration mode or the shift register configuration mode, in response to the selection signal thus read out from the SRAM.

18. The semiconductor integrated circuit according to claim 1, further comprising a test result output terminal, via which a test result based on the test data of said high-frequency receiving circuit is outputted to the semiconductor test device.

19. The semiconductor integrated circuit according to claim 1, wherein the write circuit controls the SRAM, in response to an SRAM control signal, received from the semiconductor test device, for controlling the SRAM.

20. The semiconductor integrated circuit according to claim 1, wherein said write circuit includes an address count up circuit, provided for controlling the SRAM.

21. A method for testing a semiconductor integrated circuit,
said semiconductor integrated circuit, comprising:
a high frequency receiving circuit for receiving a high frequency signal; and
a demodulation circuit for demodulating a signal from said high frequency receiving circuit, said demodulation circuit including a Static Random Access Memory (SRAM),
said semiconductor integrated circuit being constituted by one or more semiconductor chips,
said method, comprising the steps of:
(i) receiving test data for driving and testing said high frequency receiving circuit, and writing the test data into the SRAM;
(ii) reading out, from the SRAM, the test data for driving and testing said high frequency receiving circuit, and transmitting the test data which has been read out to said high frequency receiving circuit; and
(iii) driving and testing said high frequency receiving circuit, in response to the test data which has been read out from the SRAM and transmitted to said high frequency receiving circuit.

22. The method according to claim 21, wherein:
in the step (i), before writing the test data into the SRAM, (a) a test for the SRAM and (b) a test for said demodulation circuit using an Automatic Test Pattern Generation (ATPG) method are started;
the test data is stored in the SRAM, after the test for the SRAM is completed; and
both a test for said high frequency receiving circuit based on the test data, and the test for said demodulation circuit using the ATPG method are simultaneously performed.

23. The method according to claim 21, wherein the test data read out from the SRAM is parallel data, and the parallel data is transmitted to said high frequency receiving circuit.

24. The method according to claim 21, wherein the test data read out from the SRAM is parallel data, the parallel data is converted into serial data, and the serial data is transmitted to said high frequency receiving circuit.

25. The method according to claim 21, wherein a test result based on the test data is outputted to a semiconductor test device.

* * * * *